United States Patent
Hirth

(10) Patent No.: US 8,661,314 B2
(45) Date of Patent: Feb. 25, 2014

(54) METHOD AND APPARATUS FOR CALCULATING FRAME CHECK SEQUENCE

(75) Inventor: Ryan E. Hirth, Windsor, CA (US)

(73) Assignee: Broadcom Corporation, Irvine, CA (US)

( * ) Notice: Subject to any disclaimer, the term of this patent is extended or adjusted under 35 U.S.C. 154(b) by 437 days.

(21) Appl. No.: 12/728,059

(22) Filed: Mar. 19, 2010

(65) Prior Publication Data

US 2010/0241936 A1 Sep. 23, 2010

Related U.S. Application Data

(60) Provisional application No. 61/162,548, filed on Mar. 23, 2009.

(51) Int. Cl.
*H03M 13/00* (2006.01)
(52) U.S. Cl.
USPC .......................................................... 714/758
(58) Field of Classification Search
USPC .......................................................... 714/758
See application file for complete search history.

(56) References Cited

U.S. PATENT DOCUMENTS

| | | | |
|---|---|---|---|
| 6,269,464 B1 * | 7/2001 | Boussina et al. | 714/752 |
| 6,356,951 B1 * | 3/2002 | Gentry, Jr. | 709/250 |
| 6,483,804 B1 * | 11/2002 | Muller et al. | 370/230 |
| 7,139,963 B1 * | 11/2006 | Fox | 714/758 |
| 7,653,864 B2 * | 1/2010 | Schroeder | 714/776 |
| 2006/0277346 A1 * | 12/2006 | Doak et al. | 710/305 |

* cited by examiner

*Primary Examiner* — Albert Decady
*Assistant Examiner* — Enam Ahmed
(74) *Attorney, Agent, or Firm* — Sterne, Kessler, Goldstein & Fox P.L.L.C.

(57) ABSTRACT

One embodiment provides a system for calculating a checksum for a packet. During operation, the system receives a packet, pads the received packet with a number of bits having predetermined values, and calculates an initial checksum value for the padded packet. Subsequently, the system calculates a final checksum for the original packet by reversing the initial checksum value using the padded bits with predetermined values.

20 Claims, 12 Drawing Sheets

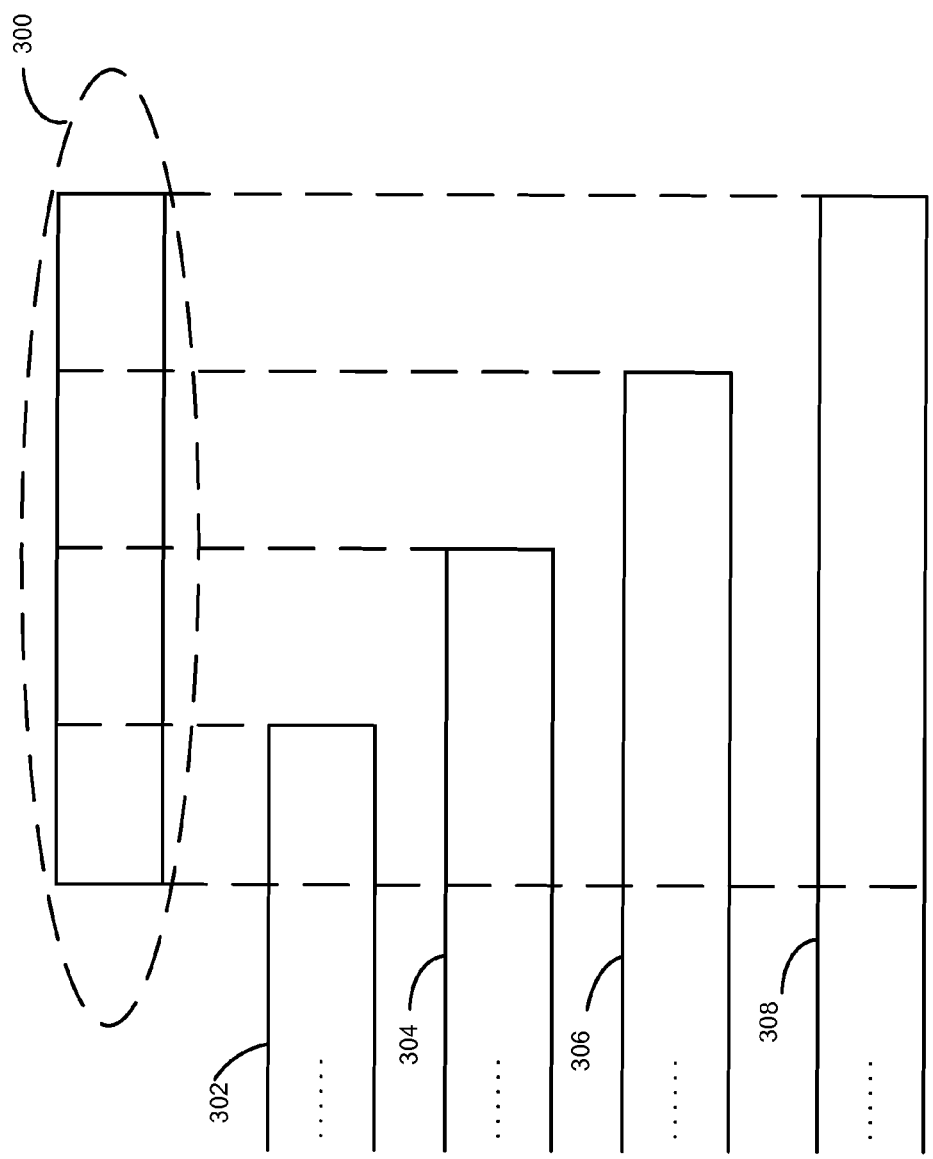

METHOD AND APPARATUS FOR CALCULATING FRAME CHECK SEQUENCE

RELATED APPLICATION

This application claims the benefit of U.S. Provisional Application No. 61/162,548, entitled "FRAME CHECK SEQUENCE REWINDING," by inventor Ryan E. Hirth, filed 23 Mar. 2009.

BACKGROUND

1. Field

This disclosure is generally related to the calculation of frame check sequence (FCS). More specifically, this disclosure is related to a rewinding method for calculating the FCS of a partially filled frame.

2. Related Art

Redundant encoding is a method of error detection that spreads the information across more bits than the original data. The error detection capability increases with added redundancy. For example, a 16-bit increase in data record length misses 1 error in 65,536 bits, while a 32-bit increase misses only 1 error in over 4-billion bits. Among various redundancy encoding error-detection techniques, cyclic redundancy codes (CRCs) are favored because they are simple to implement in binary hardware, easy to analyze mathematically, and particularly efficient at detecting common errors caused by noise in transmission channels. Cyclic redundancy code checkers (CRCCs) check for differences between transmitted data and the original data in order to detect error. Data transmission applications use CRCCs extensively for error checking The IEEE 802.3 Ethernet standard defines a frame check sequence (FCS) in the form of a 32-bit CRC (CRC-32) calculated across the entire payload to ensure data integrity.

SUMMARY

One embodiment provides a system for calculating a checksum for a packet. During operation, the system receives a packet, pads the received packet with a number of bits having predetermined values, and calculates an initial checksum value for the padded packet. Subsequently, the system calculates a final checksum for the original packet by reversing the initial checksum value using the padded bits having predetermined values.

In a variation on this embodiment, the padded bits are all zeros.

In a variation on this embodiment, the initial checksum is a cyclic redundancy check (CRC) value of the padded packet, and the final checksum is a CRC value of the original packet.

In a further variation, calculating the initial checksum value involves calculating a CRC value based on a first polynomial.

In a further variation, calculating the final checksum value involves reversing a CRC calculation based on a second polynomial, and the second polynomial is an invert of the first polynomial.

In a further variation, calculating the final checksum value involves using the initial checksum value as an input.

In a variation on this embodiment, the padded packet has a length that is a multiple of a predetermined data-path width.

In a further variation, the initial checksum value is calculated in a parallel manner based on the predetermined data-path width.

In a variation on this embodiment, the packet is an Ethernet packet.

BRIEF DESCRIPTION OF THE FIGURES

FIG. 3 presents a diagram illustrating four possible alignments between the end of a data frame and a 32-bit bus.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

As data transmission rates increase, CRCC performance is expected to increase accordingly. For lower speed data transmission, CRCC can be implemented by software-based processing within a regular computer, whereas for higher speed, dedicated hardware, such as field-programmable gate arrays (FPGAs), is preferred for implementing CRCC. As the transmission speed continues to increase, such as in a Gigabit Ethernet, parallelization may be necessary. For even higher speed, such as 10G Ethernet, the CRCC implementation in FPGAs may require a parallel processing with a data path as wide as 128 bits.

Because transmitted data frames are usually byte (eight-bit)-aligned, there is a mismatch between the input frame size and the data path for parallel processing. Traditional solutions selectively output the value of different shift registers (i.e., parallel stage) based on the alignment of the input frame. Such approaches either are slow or require too many resources. To solve such problems, embodiments of the present invention first zero-pad the input frame to align it to the same width of the processing data path, and calculate the corresponding CRC. Then the calculated CRC is rewound (calculation being reversely shifted) based on the number of padded zeros.

Figure 1:
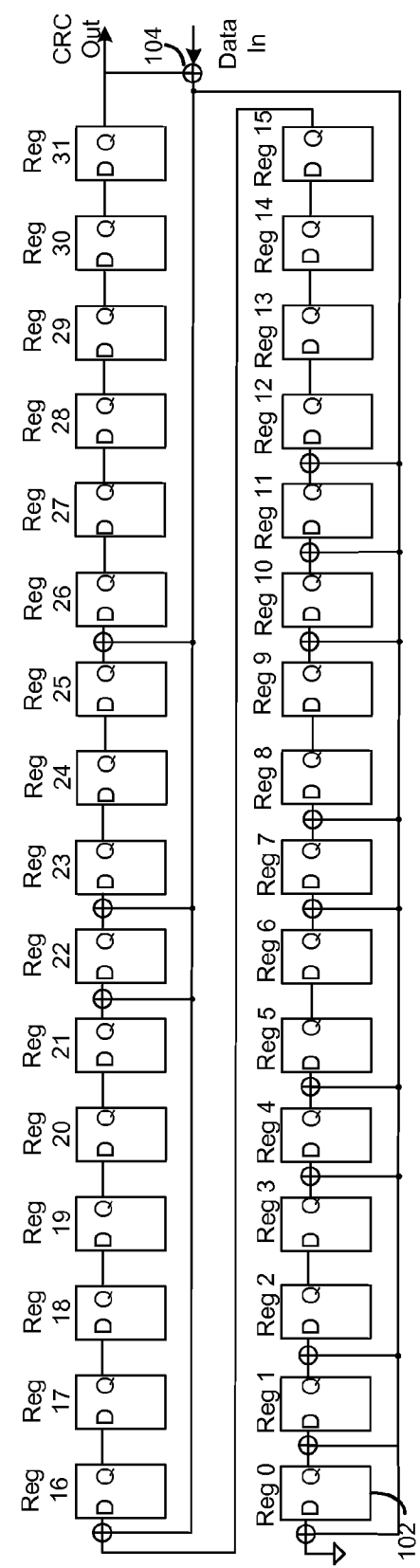
FIG. 1 presents a diagram illustrating a serial implementation for calculating CRC-32 as defined by IEEE standard 802.3 (prior art).

Typically, CRC calculations are implemented with linear-feedback shift registers (LFSRs). FIG. 1 presents a diagram illustrating a serial implementation for calculating CRC-32 as defined by IEEE standard 802.3 (prior art). IEEE standard 802.3 defines a CRC-32 generator based on polynomial $x^{32}+x^{26}+x^{23}+x^{22}+x^{16}+x^{12}+x^{11}+x^{10}+x^8+x^7+x^5+x^4+x^2+x+1$. To implement the 32-bit polynomial, 32 shift registers, such as register 102, and 15 XOR gates, such as XOR 104, are used to form a LFSR. The quotient "1" bit (output of XOR 104) is fed back and no-carry subtracted from the appropriate taps in the LFSR (Reg26, Reg23, Reg22, Reg16, Reg12, Reg11, Reg10, Reg8, Reg7, Reg5, Reg4, Reg2, Reg1, and Reg0). These bits shift forward to appear at the end and are subtracted from the next data bit, unless they are eliminated by a coinciding second bit from an earlier or later subtraction that is fed back.

Such a serial method requires ultra-high speed shift registers for Gb/s implementation and above, so the most popular approach in today's processing system is to process the data in parallel. For high-speed CRC implementations, input data is processed in parallel in byte width, word width, double word (32-bit) width, or even wider width, rather than serially.

To calculate CRCs in parallel, the serial LFSR is converted into a set of parallel equations, which can be implemented using XOR logics. For example, a 32-bit parallel CRC algorithm can be expressed as a function of the initial state bits of the shift register and the 32 data bits, and can be implemented using 32 stages of 32-bit logic that is logically equivalent to a 32-bit LFSR. In the future, for simplicity, each such 32-bit logic is referred to as an LFSR.

Figure 2A:
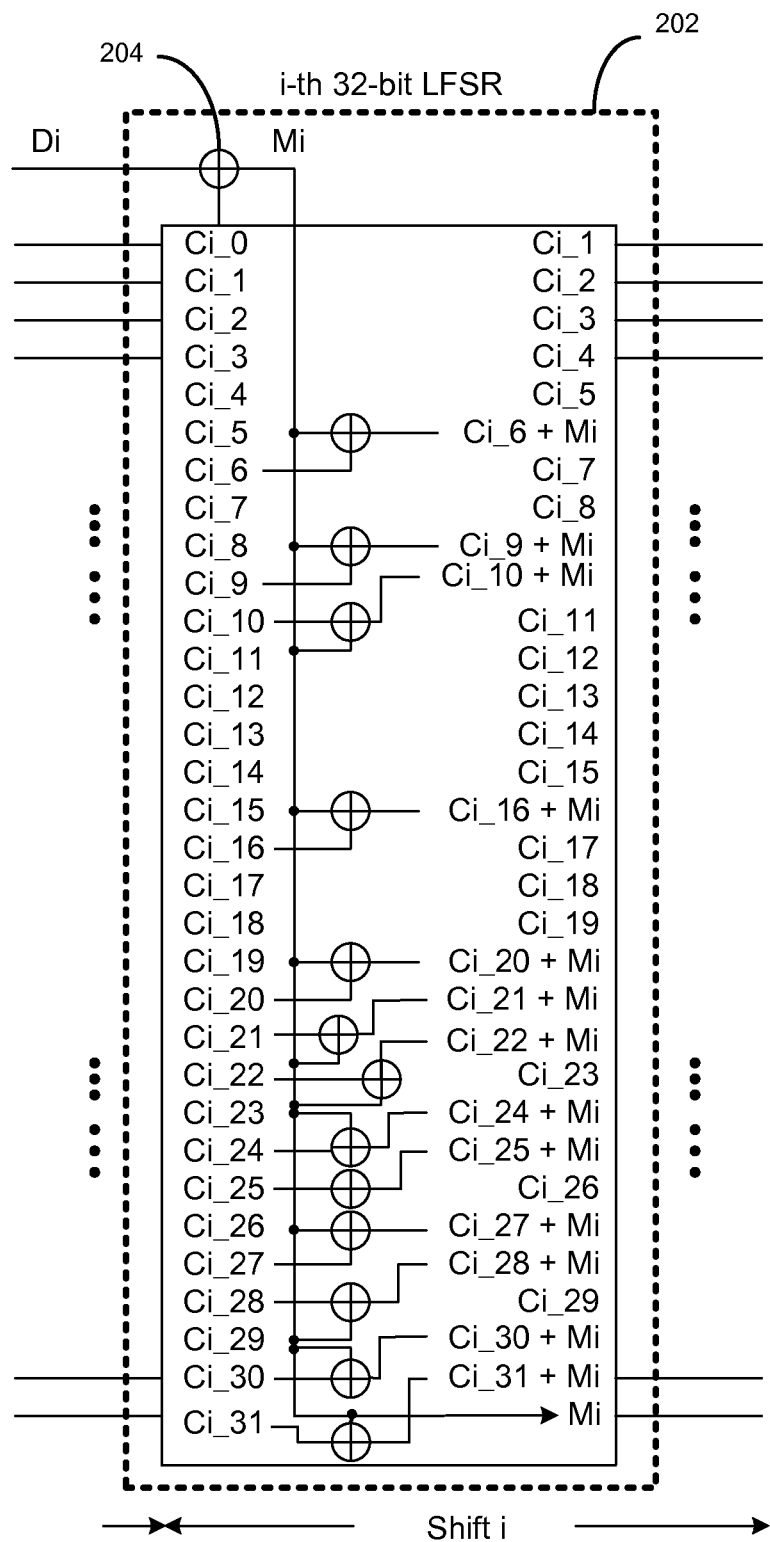
FIG. 2A presents a block diagram illustrating the i-th stage of the 32-bit linear-feedback shift registers (LFSRs) used in an implementation for the 32-bit parallel CRC-32 calculation.

FIG. 2A presents a block diagram illustrating the i-th stage of the 32-bit LFSRs used in an implementation of the 32-bit parallel CRC-32 calculation. In FIG. 2A, an i-th 32-bit LFSR 202 includes a 32-bit input Ci_0-Ci_31, and 14 XOR gates, such as XOR 204. The input of LFSR 202 is the output of a previous stage. Note that XOR 204 produces a term Ci_0⊕Di, which is named as Mi. The logical configuration of LFSR 202 is identical to the serial realization of CRC-32 shown in FIG. 1. As a result, the output of LFSR 202 is equivalent to a one-bit shift of the input combined with corresponding XOR operations. Note that input bit Ci_0 corresponds to the bit state of Reg 31, while input bit Ci_31 corresponds to the bit state of Reg 0. Ci_6⊕Mi is equivalent to the XOR logic in front of Reg26 shown in FIG. 1, and after a one-bit shift is assigned to the sixth input bit to the next stage LFSR. The output of the thirty-second LFSR is read out as the output of CRC for the thirty-two input bits.

Figure 2B:
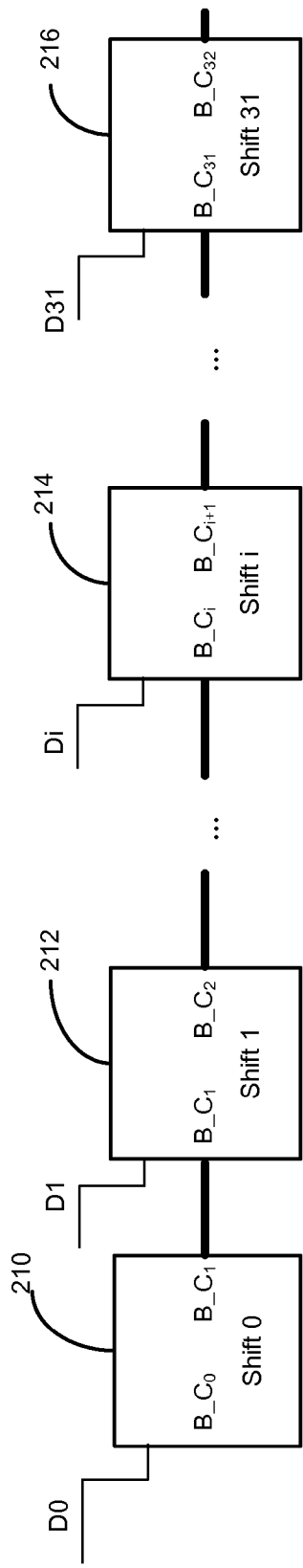
FIG. 2B presents a block diagram illustrating an exemplary implementation for the 32-bit parallel processing of CRC-32.

FIG. 2B presents a block diagram illustrating an exemplary implementation for 32-bit parallel processing of CRC-32. In FIG. 2B, a 32-bit data stream (D0-D31) is input in parallel into 32 LFSRs including LFSRs 210-216. Each LFSR has a similar structure to LFSR 202 shown in FIG. 2A. The left side (input) bus of an i-th (i=0, 1, . . . , 31) stage, which represents parallel shift i, is defined as $B\_C_i$ corresponding to [Ci_0-Ci_31] as shown in FIG. 2A, and the right side (output) bus as $B\_C_{i+1}$. It is clearly shown in FIG. 2B that the output of a previous stage LFSR is the input of the following stage LFSR. For example, the output of LFSR 210 $B\_C_1$ is the input for LFSR 212. The resulting CRC-32 is output by LFSR 216 as $B\_C_{32}$. To process the next 32 bits, the output of LFSR 216 is fed back to LFSR 210 as input.

Using parallel processing, the system is able to process CRC calculation one data chunk at a time. Depending on the transmission speed, the width of each data chunk can be byte wide, word wide, double word wide, or as wide as 128-bit. For 10 GHz implementations, it is desirable to process CRC with a width of 128-bit. Because data transmission is usually in the unit of byte, for CRC processing with wider widths, there will be a mismatch between the width of the CRC processing and the length of transmitted data frames, and such a mismatch can slow down the overall CRC processing speed. For example, a system with 32-bit wide CRC processing capability is able to process data frames in data chunks of thirty-two bits (four bytes). If the length of a transmitted data frame is a multiple of thirty-two bits, then the system can process all bits in the data frame in the same fashion. Otherwise, special care is required for the last part of the data frame that partially fills the 32-bit bus, or the data frame remainder.

FIG. 3 presents a diagram illustrating 4 possible alignments between the end of a data frame and a 32-bit bus. In FIG. 3, a 32-bit bus 300 provides data input to a 32-bit parallel CRC processing logic. Data frames 302, 304, 306 and 308 terminate at the first, second, third, and fourth byte of 32-bit bus 300, respectively. Therefore, after the parallel CRC logic performs CRC calculation on the data frames thirty-two bits at a time, the remainders for data frames 302, 304, 306, and 308 are one, two, three, and four bytes long, respectively. Note that for a chunk of data that is less than thirty-two bits long, the CRC is not the output of the right most LFSR (LFSR 216 as shown in FIG. 2B). Thus, to calculate the CRC accurately for data frames with remainders, appropriate taps are needed at the output of the LFSRs in the CRC logic.

Figure 4:
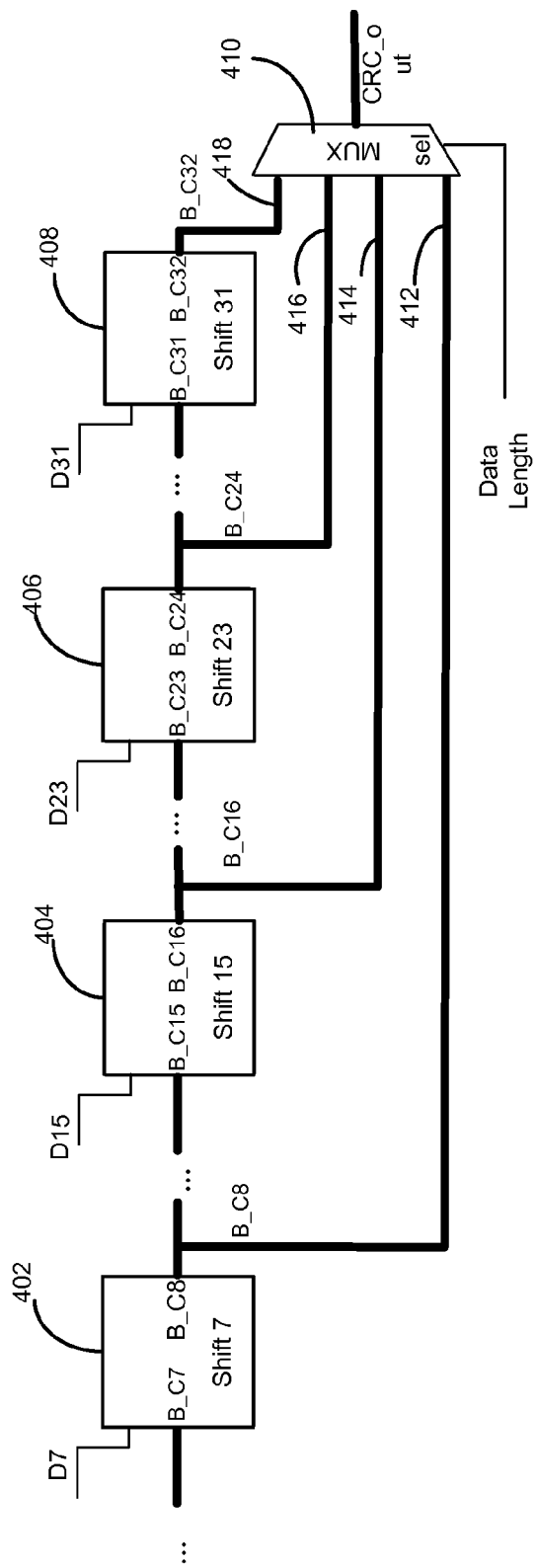
FIG. 4 presents a diagram illustrating an exemplary scheme of parallel CRC processing for data frames with arbitrary length.

FIG. 4 presents a diagram illustrating a scheme of parallel CRC processing for data frames with arbitrary length. In FIG. 4, 32 LFSRs, such as LFSRs 402, 404, 406, and 408, are used to process CRC 32 bits at a time. The structure of each LFSR is similar to the one shown in FIG. 2A. The CRCs for data frames of different remainders can be obtained and selected using appropriate taps and a multiplexer. For example, for a data frame that has a one-byte remainder, the final CRC is the output (B_C8) of the eighth stage LFSR (LFSR 402). Similarly, LFSRs 404, 406, and 408 output CRCs for data frames with two, three, and four bytes remainders, respectively. A multiplexer-selector 410 has four inputs 412, 414, 416, and 418. The output of LFSRs 402, 404, 406, and 408 are tapped as multiplexer-selector 410's inputs 412, 414, 416, and 418, respectively. When processing CRC for a data chunk of arbitrary length, multiplexer-selector 410 outputs a correct CRC based on the length of the data chunk. For example, if the data chunk is one-byte long, multiplexer-selector 410 selects input 412 as the CRC output, which corresponds to the output of LFSR 402. If the data chunk is four bytes long, multiplexer-selector 410 selects input 418 as the CRC output, which corresponds to the output of LFSR 408.

Such an approach for parallel CRC processing of data frames with arbitrary lengths has several drawbacks. Combinational logic (multiplexer-selector 410) is needed for each data chunk within the transmitted data frame, thus significantly slowing down the processing speed. In high-speed implementations, where the data path can be 128-bit wide, the processing speed suffers even more due to the increased complexity of the combinational logic.

To solve this problem and to increase the CRC processing speed, embodiments of the present invention use a rewinding technique, in which the incoming data frame is first padded with zeros to become a multiple of the width of the data path. The resulting CRC is then rewound by a number of bits that equals the number of padded zeros.

Figure 5:
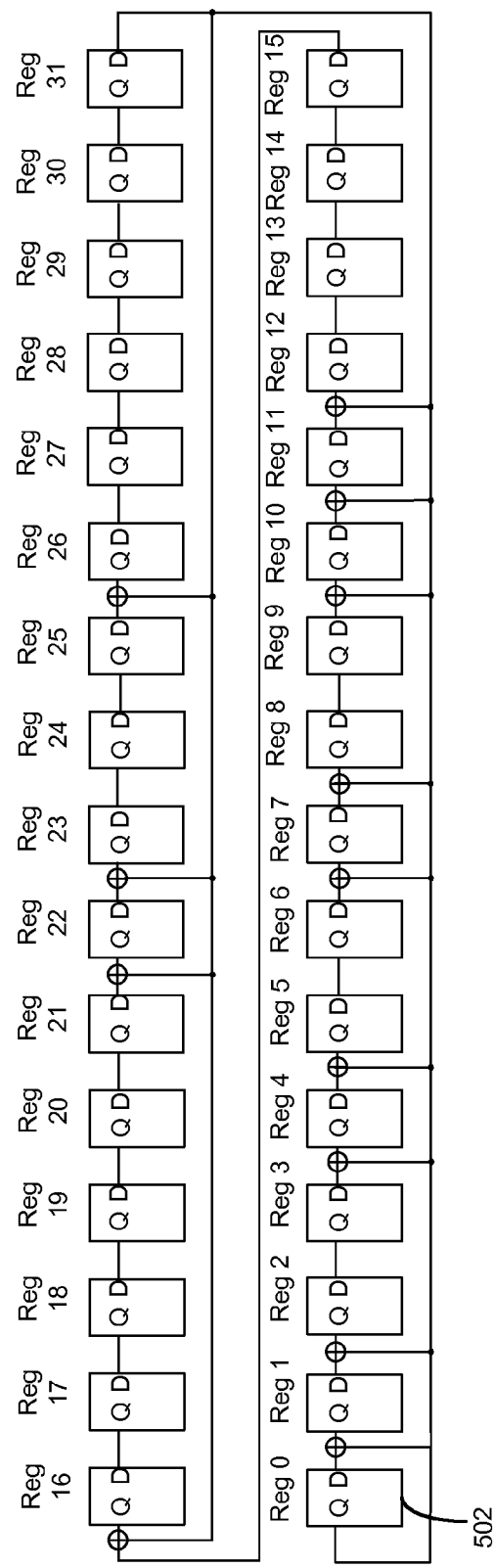
FIG. 5 presents a diagram illustrating a serial implementation for rewinding a CRC-32 in accordance with one embodiment of the present invention.

FIG. 5 presents a diagram illustrating a serial implementation for rewinding a CRC-32 in accordance with one embodiment of the present invention. Similar to CRC calculation, CRC rewinding can be implemented with LFSR. Because the polynomial used for CRC rewinding is the invert of the one used for CRC calculation, the LFSR shown in FIG. 5 is similar to the one shown in FIG. 1, except that the direction of the shift is reversed. As a result, the input and output of a register, such as register 502, are reversed compared with registers shown in FIG. 1. Because all padded bits are zeros, no external input is needed for the rewinding LFSR. The initial bit stage of the 32 registers is the CRC-32 to be rewound, and after a number of shifts, which equals the number of padded zeros, the bit stage of the 32 registers is the result of the rewound CRC-32.

Figure 6:
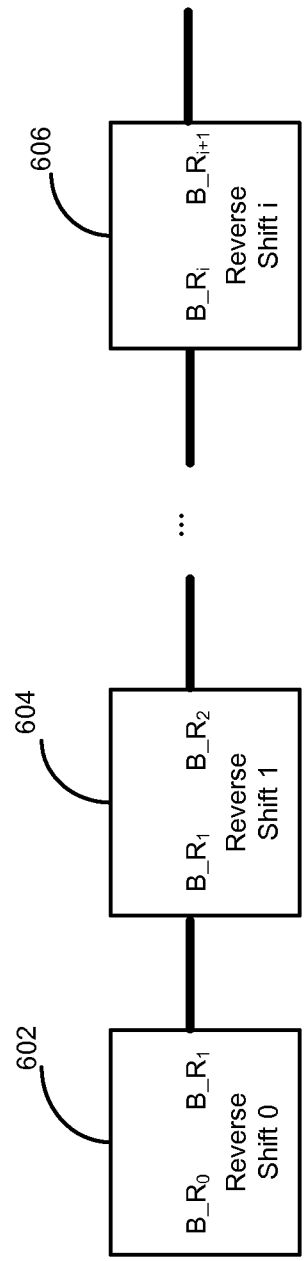
FIG. 6 presents a block diagram illustrating an exemplary parallel implementation for rewinding a CRC-32 in accordance with one embodiment of the present invention.

FIG. 6 presents a diagram illustrating a parallel implementation of rewinding a CRC-32 in accordance with one embodiment of the present invention. Similar to FIG. 2B, a number of LFSRs, such as LFSRs 602, 604 and 606, are used for parallel CRC rewinding, and the number of LFSRs equals the width of the parallel processing. For example, to rewind the CRC 32 bits at a time, 32 LFSRs will be needed. The structure of each LFSR can be similar to the one shown in FIG. 2A, except that the 32-bit logic is now equivalent to the one shown in FIG. 5. Similar to FIG. 2B, the left side (input) bus of an i-th LFSR stage, which represents parallel shift i, is defined as $B\_R_i$, and the right side (output) bus as $B\_R_{i+1}$. The output of a previous LFSR stage is the input of a next LFSR stage. For example, the output of LFSR 602, $B\_R_1$, is the input of LFSR 604. The initial input of the first stage LFSR (LFSR 602), $B\_R_0$, is the CRC that needs to be rewound. The number of shifts needed to rewind the CRC equals the number of padded zeros. For example, if three bytes of zeros are padded, then to reverse the CRC for three bytes, twenty-four reverse shifts will be needed; thus, twenty-four LFSRs are needed to output the rewound CRC.

Figure 7A:
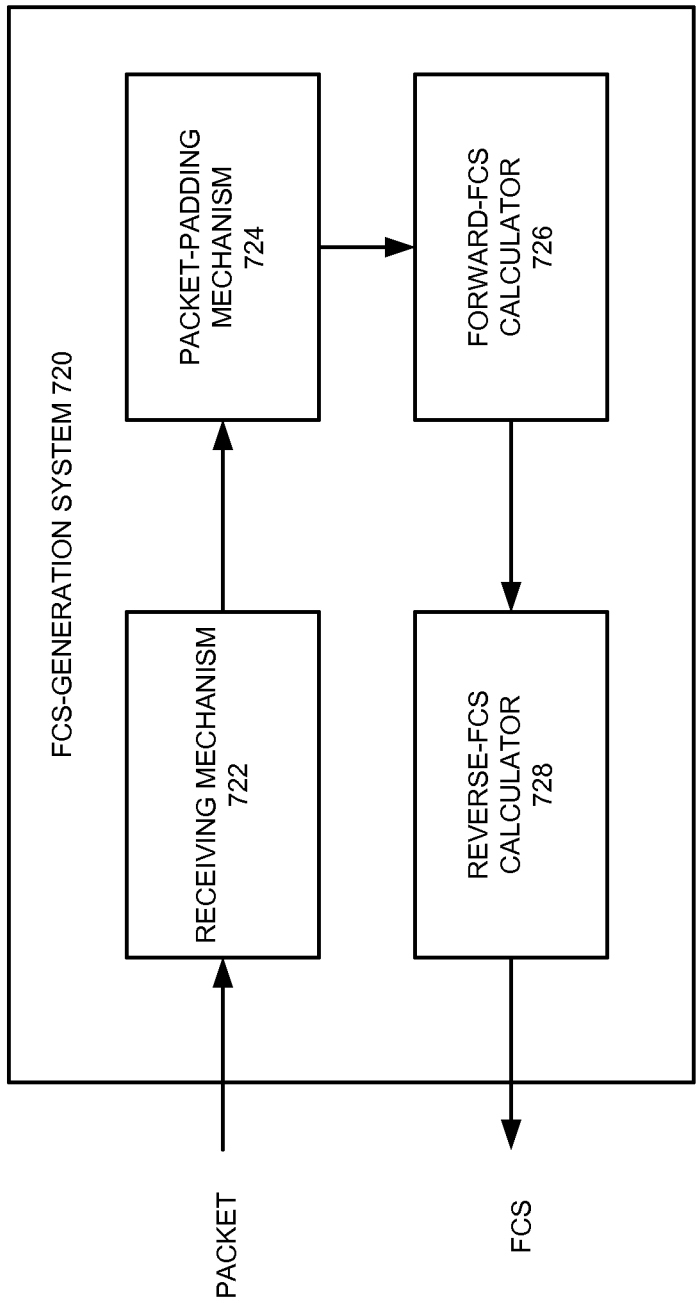
FIG. 7A presents a diagram illustrating an exemplary system for generating a FCS for a data packet in accordance with an embodiment of the present invention.

FIG. 7A presents a diagram illustrating an exemplary system for generating a FCS for a data packet in accordance with an embodiment of the present invention. FCS-generation system 720 includes a packet-receiving mechanism 722, a packet-padding mechanism 724, a forward-FCS calculator 726, and a reverse-FCS calculator 728.

During operation, packet-receiving mechanism 722 receives a data packet. Packet-padding mechanism 724 pads the received data packet with a known bit pattern to ensure that the length of the padded packet is a multiple of the data-width n used by forward-FCS calculator 726. For example, packet-padding mechanism 724 can pad the packet with all zeros or all ones. Subsequently, forward-FCS calculator 726 calculates the FCS for the padded data packet. In one embodiment, the FCS of the data packet is calculated as a 32-bit CRC. In a further embodiment, forward-FCS calculator 726 calculates the FCS parallelly n bits at a time.

After the padded data packet being fed through forward-FCS calculator 726, the output of FCS-726 is sent to reverse-FCS calculator 728, which in turn performs FCS rewinding. The total number of bits to be rewound is determined by the number of padded zeros.

Figure 7B:
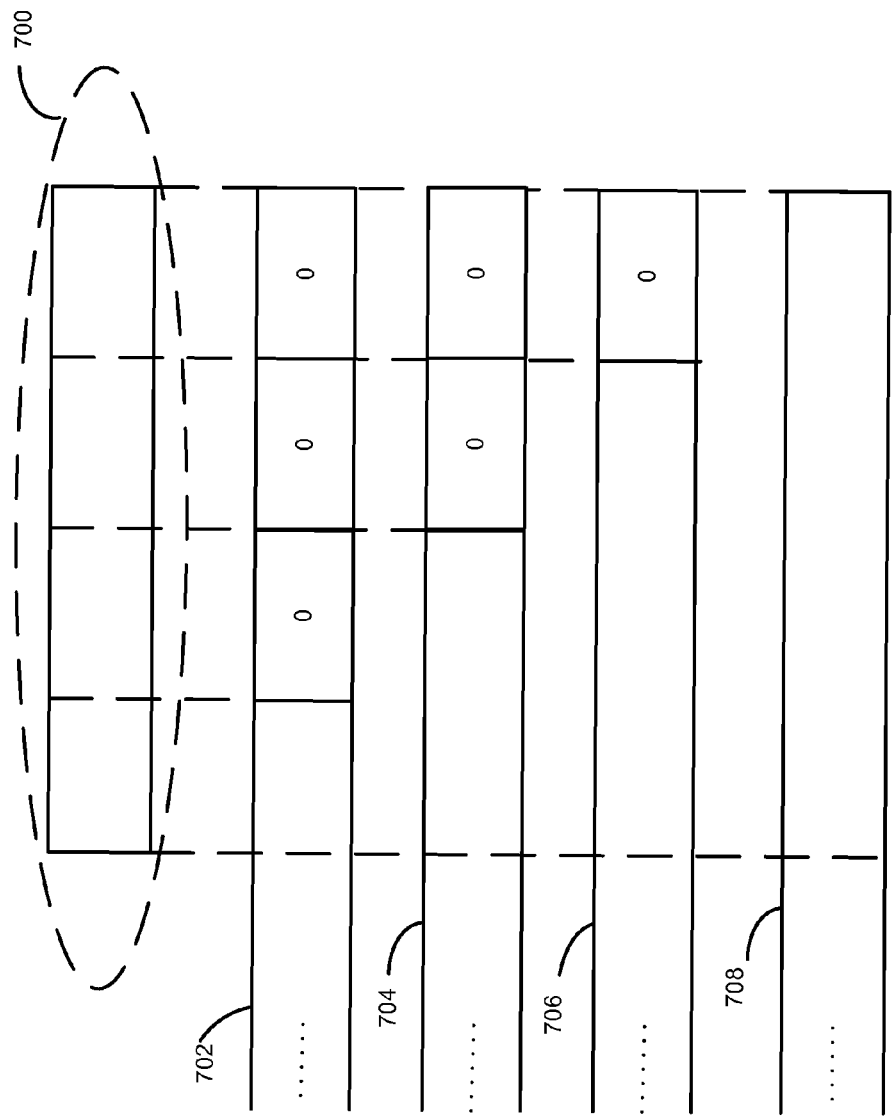
FIG. 7B presents a diagram illustrating four possible zero-padding scenarios for matching data frames with a 32-bit bus in accordance with one embodiment of the present invention.

FIG. 7B presents a diagram illustrating four possible zero-padding scenarios for matching data frames with a 32-bit bus in accordance with one embodiment of the present invention. In FIG. 7, a 32-bit bus 700 provides data input to a 32-bit parallel CRC processing logic. Data frames 702, 704, 706 and 708 terminate at the first, second, third, and fourth byte of 32-bit bus 700, respectively. In order to make the end of the data frames align with the 32-bit bus, three, two, one, and zero bytes of zeros are padded to data frames 702, 704, 706, and 708, respectively.

Figure 8:
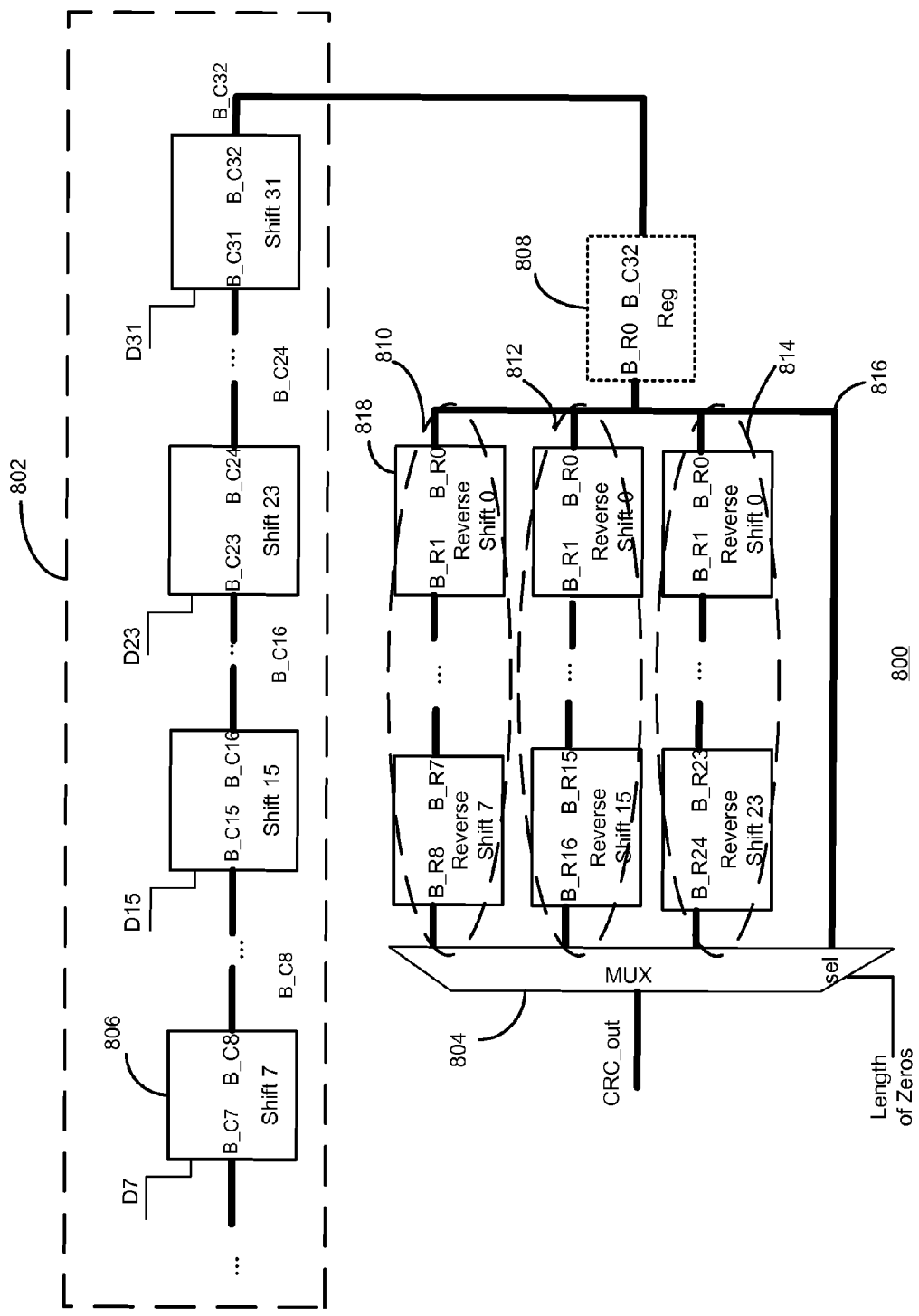
FIG. 8 presents a diagram illustrating an exemplary CRC processing system for data frames with arbitrary length in accordance with one embodiment of the present invention.

FIG. 8 presents a diagram illustrating a CRC processing system for data frames with arbitrary length in accordance with one embodiment of the present invention. CRC processing system 800 includes a forward-CRC calculator 802, a multiplexer-selector 804, and a number of CRC rewinders, including CRC rewinders 810, 812, and 814. Forward-CRC calculator 802 is used for the 32-bit parallel calculation of CRC-32 of an incoming data frame which is pre-padded with zeros. Forward-CRC calculator 802 includes a number of LFSRs, such as LFSR 806. The structure of forward-CRC calculator 802 and LFSR 806 are similar to the ones shown in FIG. 2B and FIG. 2A, respectively.

CRC processing system 800 can also include an optional register 808 for loading the calculated CRC-32 of the zero-padded data frame, which is the output of the right most LFSR of CRC calculator 802, B_C32. The output of register 808 is split into four branches, and three of the four branches are sent to CRC rewinders 810-814. The fourth branch of the output of register 808, labeled as branch 816, is a copy of the output of CRC calculator 802. Each of CRC rewinders 810-814 includes a number of LFSRs, such as LFSR 818. The structure of CRC rewinder 810 is similar to the one shown in FIG. 6. Depending on the number of LFSRs, or the number of shifts, in each CRC rewinder, CRC rewinders 810, 812, and 814 can rewind a CRC by one, two, and three bytes, respectively. For example, CRC rewinder 810 includes eight LFSRs, and the output of its left most LFSR, B_R8, is the CRC-32 of a data frame less eight padded zeros. The outputs of CRC rewinders 810-814 and branch 816 are sent to multiplexer-selector 804 as inputs. Based on the number of zeros that are used to pad an original data frame, multiplexer-selector 804 selects a corresponding output as the correct CRC-32 of the original data frame. For example, if there are three bytes of zeros padded to a data frame to make its length a multiple of thirty-two, then multiplexer-selector 804 selects the output of CRC rewinder 814 as the output CRC for the data frame. If the length of the original data frame is a multiple of thirty-two, no zeros are padded. Accordingly, multiplexer-selector 804 selects branch 816 as output CRC, which equals the output of CRC calculator 802.

Figure 9:
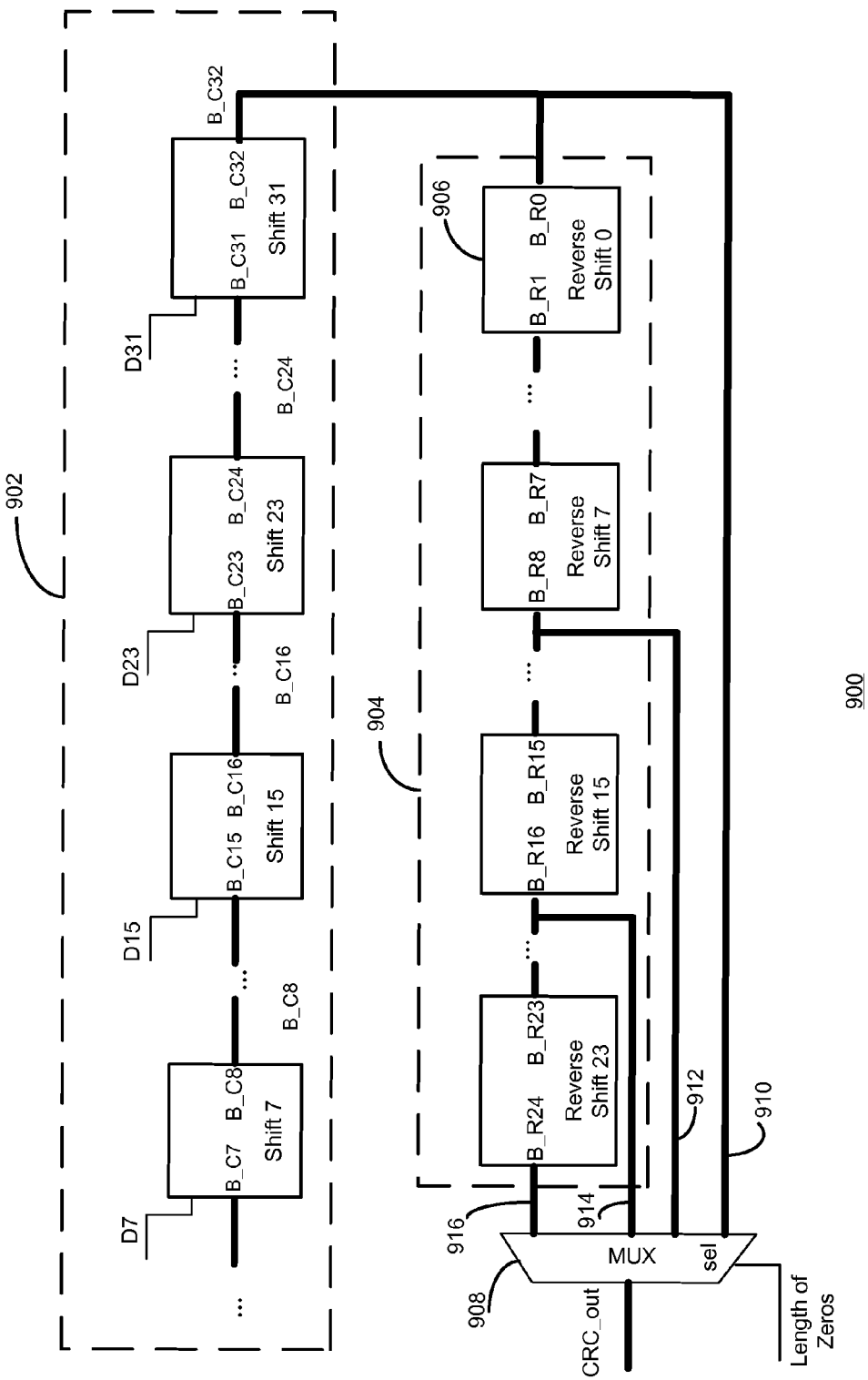
FIG. 9 presents a diagram illustrating an exemplary CRC processing system for data frames with arbitrary length in accordance with one embodiment of the present invention.

In addition to utilizing multiple CRC rewinders, other configurations are also possible for CRC calculations. FIG. 9 presents a diagram illustrating a CRC processing system for data frames with arbitrary length in accordance with one embodiment of the present invention. In FIG. 9, CRC processing system 900 includes a CRC calculator 902, a CRC rewinder 904, and a multiplexer-selector 908. The structure of CRC calculator 902 is similar to CRC calculator 802 shown in FIG. 8. CRC rewinder 904 includes a number of LFSRs, such as LFSR 906. The difference between CRC processing system 900 and CRC processing system 800 shown in FIG. 8 is that CRC processing system 900 deploys only one CRC rewinder instead of three, and the inputs of multiplexer-selector 908, including inputs 910-916, are tapped from different shift stages of CRC rewinder 904. For example, input 910 is tapped from the input of CRC rewinder 904, or input of LFSR 906, which equals the output of CRC calculator 902. Input 912 is tapped from the output of the eighth shift stage of CRC rewinder 904, which corresponds to eight bits (one byte) of CRC rewinding. Similarly, inputs 914 and 916 correspond to two and three bytes of CRC rewinding, respectively. Similarly, multiplexer-selector 908 selects one of inputs 910-916 as CRC output for a data frame based on the number of padded zeros.

Figure 10:
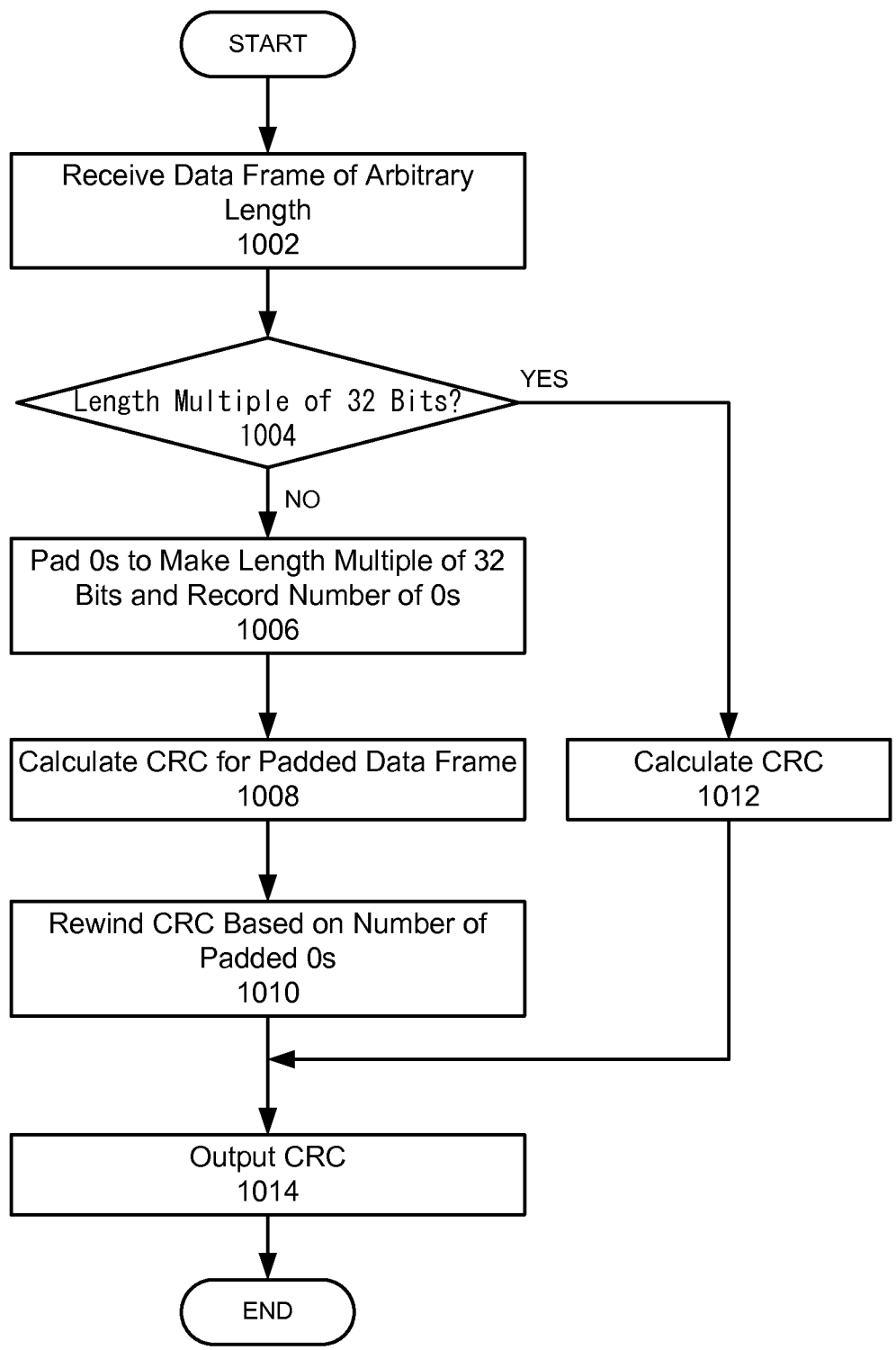
FIG. 10 presents a flowchart illustrating the process of CRC calculation for a data frame with arbitrary length in accordance with one embodiment of the present invention.

FIG. 10 presents a flow chart illustrating the process of CRC calculation for a data frame with arbitrary length in accordance with one embodiment of the present invention. During operation, the system receives a data frame of arbitrary length (operation 1002) and determines if the length of the received data frame is a multiple of the CRC processing width, such as thirty-two bits (operation 1004). If so, the system calculates the CRC (operation 1012) and outputs the result (operation 1014). If not, the system pads zeros to the data frame to make its length a multiple of the CRC processing width and records the number of padded zeros (operation 1006). The system then calculates the CRC for the padded data frame (operation 1008). Afterwards, the system rewinds the calculated CRC for a number of bits that equals the number of padded zeros (operation 1010) and outputs the rewound CRC (operation 1014).

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus, comprising:
a receiving mechanism configured to receive a first packet;
a padding mechanism configured to pad the first received packet with a number of bits having predetermined values to provide a second packet;
a first logic element configured to calculate an initial checksum value corresponding to the second packet; and
a second logic element configured to shift the initial checksum value by a number of shifts equal to the number of padded bits to rewind the initial checksum value and to provide a final checksum value corresponding to the first packet.

2. The apparatus of claim 1, wherein the predetermined values are all zeros.

3. The apparatus of claim 1, wherein the initial checksum value is a cyclic redundancy check (CRC) value of the second packet, and
wherein the final checksum value is a CRC value of the first packet.

4. The apparatus of claim 1, wherein the first logic element is configured to calculate the initial checksum value based on a first polynomial.

5. The apparatus of claim 4, wherein the second logic element is further configured to calculate the final checksum value by reversing the initial checksum value calculation based on a second polynomial, and
wherein the second polynomial is an invert of the first polynomial.

6. The apparatus of claim 1, wherein the second logic element is further configured to calculate the final checksum value utilizing a plurality of processing stages, and wherein an initial stage of the plurality of processing stages is set based on the initial checksum value.

7. The apparatus of claim 1, wherein the second packet has a length that is a multiple of a data-path width of the first logic element.

8. The apparatus of claim 7, wherein the first logic element is further configured to calculate the initial checksum value by processing bits of the initial checksum value in a parallel manner according to the data-path width.

9. The apparatus of claim 1, wherein the first packet is an Ethernet packet.

10. A system for calculating a checksum value for a first packet, comprising:
a padding mechanism configured to pad the first packet with a number of zeros to provide a second packet;
a forward-checksum calculator having a predetermined data-path width configured to calculate an initial checksum value corresponding to the second packet in a parallel manner according to the predetermined data-path width; and
a reverse-checksum calculator configured to shift the initial checksum value by a number of shifts equal to the number of padded zeros to calculate a final checksum value corresponding to the first packet.

11. The system of claim 10, wherein the forward-checksum calculator is configured to perform the initial checksum value calculation based on a first polynomial.

12. The system of claim 11, wherein the initial checksum value is a cyclic redundancy check (CRC) value of the second packet, and
wherein the final checksum value is a CRC value of the first packet.

13. The system of claim 11, wherein the reverse-checksum calculator is configured to calculate the final checksum value by reversing the checksum value calculation based on a second polynomial, and
wherein the second polynomial is an invert of the first polynomial.

14. The system of claim 10, wherein the second packet has a length that is a multiple of the predetermined data-path width.

15. The system of claim 10, wherein the first packet is an Ethernet packet.

16. In a cyclic redundancy code (CRC) checking logic device, a method comprising:
receiving a first packet of data having a first bit length;
comparing the first bit length to a second bit length;

calculating a first CRC value corresponding to the first packet if the first bit length and the second bit length are multiples of one another, and otherwise;

padding the first packet with a number of zero bits such that the first bit length and the second bit length are multiples of one another, to provide a second packet, calculating a second CRC value corresponding to the second packet, and shifting the second CRC value of the second packet by a number of shifts equal to the number of zero bits to calculate the first CRC value.

17. The method of claim 16, wherein comparing the first bit length to the second bit length is performed by a forward checksum calculator having a predetermined data-path width, and wherein the second bit length is equal to the predetermined data-path width.

18. The method of claim 16, wherein calculating the second CRC value comprises:

calculating the second CRC value based on a first polynomial.

19. The method of claim 18, wherein shifting the second CRC value comprises:

shifting the second CRC value by performing a calculation on the second CRC value utilizing a second polynomial to determine the first CRC value, the second polynomial being an invert of the first polynomial.

20. The method of claim 17, wherein calculating the first CRC value comprises:

calculating the first CRC value by processing bits of the first CRC value of the packet in a parallel manner according to the predetermined data-path width.

\* \* \* \* \*

UNITED STATES PATENT AND TRADEMARK OFFICE
CERTIFICATE OF CORRECTION

PATENT NO. : 8,661,314 B2
APPLICATION NO. : 12/728059
DATED : February 25, 2014
INVENTOR(S) : Ryan E. Hirth It is certified that error appears in the above-identified patent and that said Letters Patent is hereby corrected as shown below:

In the Claims

At column 8, line 48, please replace "of claim 11" with --of claim 10--.

At column 8, line 55, please replace "the checksum" with --the initial checksum--.

At column 9, line 4, please replace "bits such" with --bits, such--.

Signed and Sealed this
Twenty-fourth Day of June, 2014

Michelle K. Lee
*Deputy Director of the United States Patent and Trademark Office*